US010580738B2

(12) United States Patent
Sikka et al.

(10) Patent No.: US 10,580,738 B2
(45) Date of Patent: Mar. 3, 2020

(54) DIRECT BONDED HETEROGENEOUS INTEGRATION PACKAGING STRUCTURES

(71) Applicant: INTERNATIONAL BUSINESS MACHINES CORPORATION, Armonk, NY (US)

(72) Inventors: Kamal K. Sikka, Poughkeepsie, NY (US); Jon A. Casey, Poughkeepsie, NY (US); Joshua Rubin, Albany, NY (US); Arvind Kumar, Chappaqua, NY (US); Dinesh Gupta, Hopewell Junction, NY (US); Charles L. Arvin, Poughkeepsie, NY (US); Mark W. Kapfhammer, Poughkeepsie, NY (US); Steve Ostrander, Poughkeepsie, NY (US); Maryse Cournoyer, Québec (CA); Valérie A. Oberson, St-Alphonse de Granby (CA); Lawrence A. Clevenger, Saratoga Springs, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/926,044

(22) Filed: Mar. 20, 2018

(65) Prior Publication Data
US 2019/0295952 A1  Sep. 26, 2019

(51) Int. Cl.
*H01L 23/538* (2006.01)
*H01L 23/31* (2006.01)
(Continued)

(52) U.S. Cl.
CPC ...... *H01L 23/5381* (2013.01); *H01L 23/3157* (2013.01); *H01L 23/367* (2013.01);
(Continued)

(58) Field of Classification Search
CPC ............ H01L 23/5381; H01L 23/3157; H01L 23/367; H01L 24/16; H01L 25/0652
See application file for complete search history.

(56) References Cited

U.S. PATENT DOCUMENTS

| 5,914,535 A | 6/1999 | Brandenburg |
| 6,424,034 B1 | 7/2002 | Ahn et al. |

(Continued)

OTHER PUBLICATIONS

Becker et al., "Heterogeneous integration-packaging on and in organic substrates." Proc. IMAPS International Symposium on Microelectronics, vol. 2011, No. 1, pp. 000142-000151 (2011).
(Continued)

*Primary Examiner* — Ida M Soward
(74) *Attorney, Agent, or Firm* — Cantor Colburn LLP; Alvin Borromeo

(57) ABSTRACT

Direct bonding heterogeneous integration packaging structures and processes include a packaging substrate with first and second opposing surfaces. A trench or a pedestal is provided in the first surface. A bridge is disposed in the trench or is adjacent the pedestal sidewall, wherein the bridge includes an upper surface coplanar with the first surface of the package substrate. At least two chips in a side by side proximal arrangement overly the bridge and the packaging substrate, wherein the bridge underlies peripheral edges of the at least two chips in the side by side proximal arrangement. The at least two chips include a plurality of electric connections that are directly coupled to corresponding electrical connections on the bridge and on the packaging substrate.

15 Claims, 4 Drawing Sheets

(51) Int. Cl.
*H01L 23/36* (2006.01)
*H01L 25/065* (2006.01)
*H01L 23/367* (2006.01)
*H01L 23/00* (2006.01)

(52) U.S. Cl.
CPC .......... *H01L 24/16* (2013.01); *H01L 25/0652* (2013.01); *H01L 2224/16145* (2013.01); *H01L 2224/16227* (2013.01); *H01L 2225/06513* (2013.01); *H01L 2225/06517* (2013.01)

(56) References Cited

U.S. PATENT DOCUMENTS

| | | | |
|---|---|---|---|
| 6,642,080 B1 | 11/2003 | Ference et al. | |
| 8,164,917 B2* | 4/2012 | Shi | H01L 23/13 361/761 |
| 8,274,149 B2* | 9/2012 | Chang | H01L 21/563 257/668 |
| 8,288,854 B2* | 10/2012 | Weng | H01L 23/13 257/686 |
| 8,536,695 B2 | 9/2013 | Liu et al. | |
| 9,275,955 B2 | 3/2016 | Mahajan et al. | |
| 9,349,703 B2* | 5/2016 | Chiu | H01L 24/23 |
| 9,379,090 B1* | 6/2016 | Syed | H01L 25/0655 |
| 9,418,966 B1* | 8/2016 | Kwon | H01L 23/488 |
| 9,431,347 B2 | 8/2016 | Kunieda et al. | |
| 9,443,824 B1* | 9/2016 | We | H01L 25/0652 |
| 9,666,559 B2* | 5/2017 | Wang | H01L 25/0655 |
| 9,754,890 B2* | 9/2017 | Deshpande | H01L 23/5383 |
| 9,875,969 B2* | 1/2018 | Braunisch | H01L 23/13 |
| 10,163,798 B1* | 12/2018 | Alur | H01L 23/3128 |
| 10,224,272 B2* | 3/2019 | Kim | H01L 21/6835 |
| 10,418,329 B2* | 9/2019 | Li | H01L 24/17 |
| 2007/0235215 A1 | 10/2007 | Bathan et al. | |
| 2008/0296056 A1 | 12/2008 | Kinoshita et al. | |
| 2011/0068459 A1 | 3/2011 | Pagaila et al. | |
| 2012/0220056 A1* | 8/2012 | Shi | H01L 23/13 438/3 |
| 2013/0264684 A1 | 10/2013 | Yu et al. | |
| 2014/0091474 A1 | 4/2014 | Starkston et al. | |
| 2014/0299999 A1* | 10/2014 | Hu | H01L 21/56 257/774 |
| 2015/0069624 A1 | 3/2015 | Pham et al. | |
| 2015/0116965 A1* | 4/2015 | Kim | H05K 1/11 361/767 |
| 2015/0228583 A1* | 8/2015 | Karhade | H01L 23/538 257/774 |
| 2015/0255411 A1* | 9/2015 | Karhade | G06F 1/1686 361/679.55 |
| 2015/0262931 A1* | 9/2015 | Vincent | H01L 21/76838 257/773 |
| 2015/0318236 A1* | 11/2015 | Zhang | H01L 24/16 257/773 |
| 2016/0133552 A1* | 5/2016 | Roy | H01L 23/13 174/261 |
| 2016/0133571 A1* | 5/2016 | Lee | H01L 21/56 257/774 |
| 2016/0141234 A1* | 5/2016 | We | H01L 23/5385 361/767 |
| 2016/0155705 A1* | 6/2016 | Mahajan | H01L 23/5381 438/107 |
| 2016/0204049 A1* | 7/2016 | Chiu | H01L 23/5381 257/522 |
| 2016/0293572 A1 | 10/2016 | We et al. | |
| 2018/0226331 A1* | 8/2018 | Sarkar | H01L 23/49827 |
| 2018/0358296 A1* | 12/2018 | Li | H01L 23/5381 |

OTHER PUBLICATIONS

Braunisch, et al., "High-speed performance of silicon bridge die-to-die interconnects", IEEE 20th Conference on Electrical Performance of Electronic Packaging and Systems (EPEPS), pp. 95-98 (2011).

Hu et al., "Embedded glass interposer for heterogeneous multi-chip integration", IEEE 65th Electronic Components and Technology Conference (ECTC), pp. 314-317 (2015).

Kao et al., "Development of Through Silicon Via (TSV) interposer for memory module flip chip package" Proc. 62nd IEEE Electronic Components and Technology Conference (ECTC 2012), pp. 1461-1466 (2012).

Khan et al., "Multichip embedding technology using fine-pitch Cu—Cu interconnections." IEEE Transactions on Components, Packaging and Manufacturing Technology 3, No. 2 pp. 197-204 (2013).

Liang et al., "Development of Non-TSV Interposer (NTI) for High Electrical Performance Package." IEEE 66th Electronic Components and Technology Conference (ECTC), pp. 31-36 (2016).

Mahajan et al., "Embedded Multi-die Interconnect Bridge (EMIB)—A High Density, High Bandwidth Packaging Interconnect." IEEE 66th Electronic Components and Technology Conference (ECTC), pp. 557-565 (2016).

Oi et al., "Development of New 2.5D Package with Novel Integrated Organic Interposer Substrate with Ultra-fine Wiring and High Density Bumps", Proc. IEEE 64th Electronic Components & Technology Conference (ECTC), pp. 348-353 (2014).

Sutanto et al., "Development of Chip-on-Chip with Face to Face Technology as a Low Cost Alternative for 3D Packaging", Proc. IEEE 63rd Electronic Components & Technology Conference (ECTC), pp. 955-965 (2013).

Tseng et al., "InFO (Wafer Level Integrated Fan-Out) Technology", IEEE 66th Electronic Components and Technology Conference (ECTC), pp. 1-6 (2016).

Yoon et al., "Fanout Flipchip eWLB (embedded Wafer Level Ball Grid Array) Technology as 2.5D Packaging Solutions", Proc. IEEE 63rd Electronic Components & Technology Conference (ECTC), pp. 1855-1860 (2013).

Yu, "New system-in-package (SIP) integration technologies." Proc. IEEE 2014 Custom Integrated Circuits Conference (CICC), pp. 1-6 (2014).

Zia et al., "Chip-to-chip interconnect integration technologies." IEICE Electronics Express 13, No. 6 pp. 1-16 (2016).

* cited by examiner

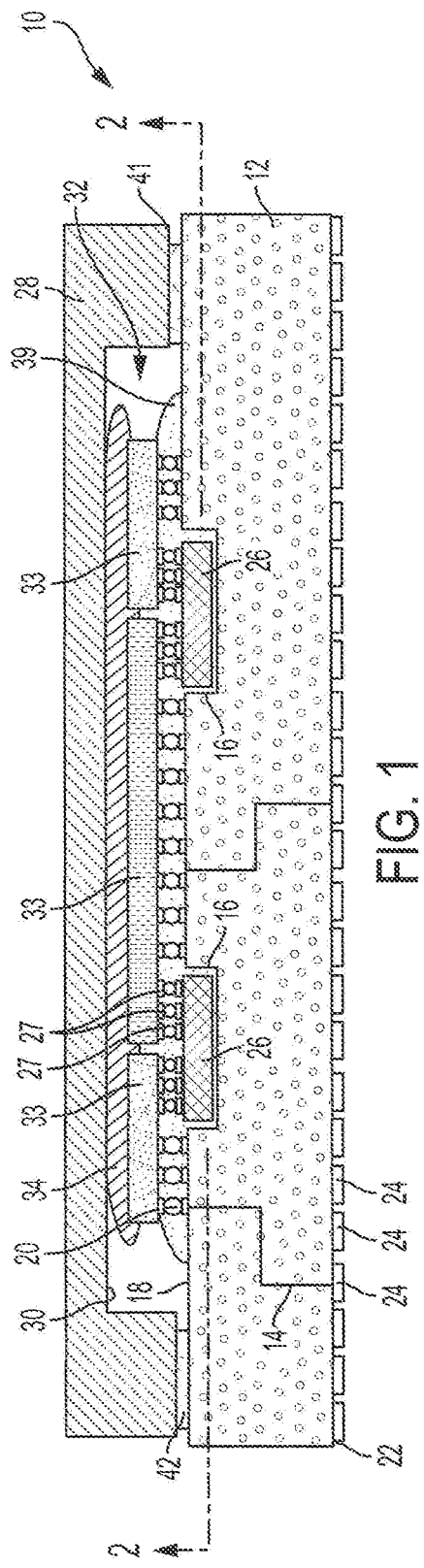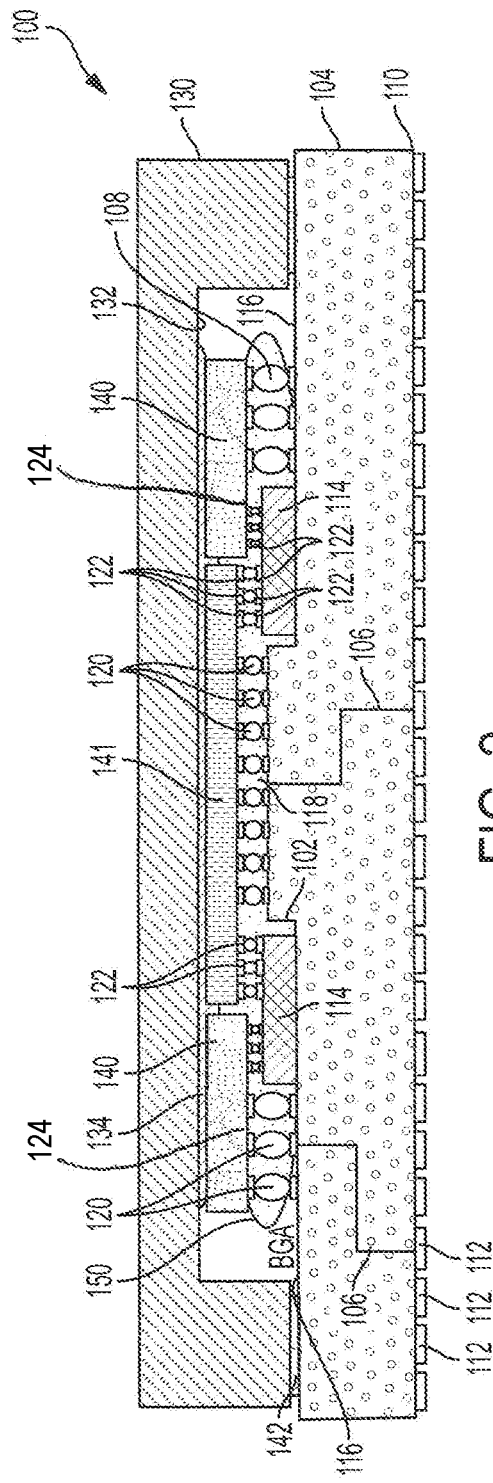

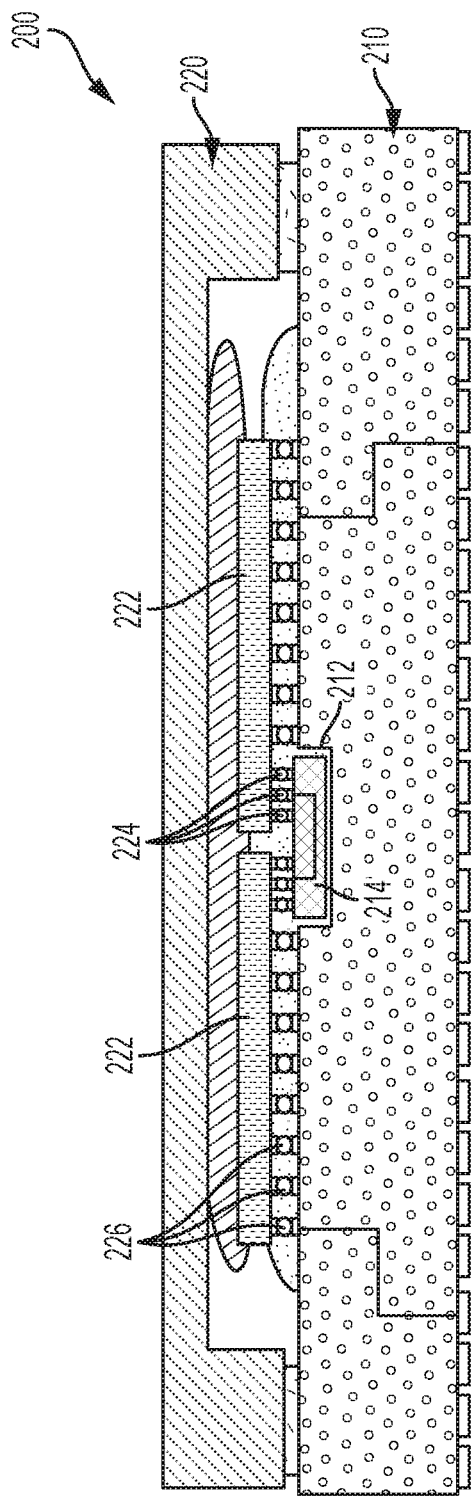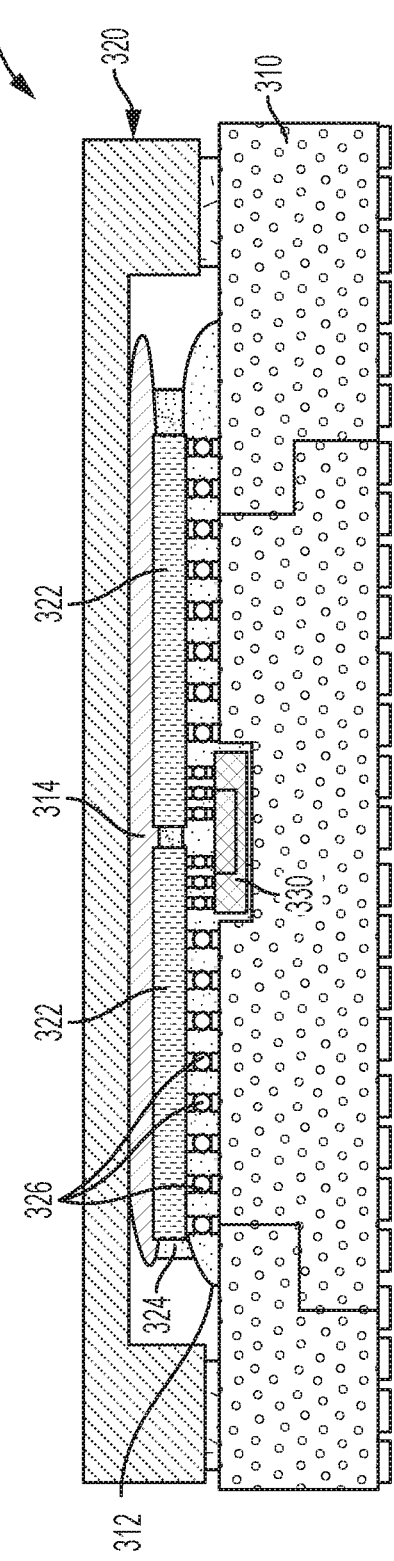

DIRECT BONDED HETEROGENEOUS INTEGRATION PACKAGING STRUCTURES

BACKGROUND

The present invention generally relates to fabrication methods and resulting structures for semiconductor devices. More particularly, the present invention generally relates to direct bonded heterogeneous integration chip packaging structures and processes that do not utilize an interposer containing through-vias.

Packaging is one of the final manufacturing processes transforming devices into functional products for the end user. Packaging must provide electrical and photonic connections for signal input and output, power input, and voltage control. It also provides for thermal dissipation and the physical protection required for reliability.

In the electronic packaging field, there is a drive to develop thinner and larger structures. In 3D chip stacks, chips or dice are layered on top of one another in a three-dimensional stack with electrical interconnects between layers. This configuration has many benefits, such as providing a designer with the ability to place an increased number of chips in a given two-dimensional area with an increased amount of electrical communications between them. In 2.5D packages, an interconnect substrate known as an interposer is used to provide the high density interconnects. The interposer is placed between another underlying substrate and the dies, where the interposer contains through silicon vias (TSVs) connecting the metallization layers on its upper and lower surfaces.

SUMMARY

Embodiments of the present invention are generally directed to integrated circuit packaging structures and methods for forming the packaging structures. A non-limiting example of an integrated circuit packaging structure according to embodiments of the invention includes an integrated circuit packaging structure free of an interposer layer. The packaging structure includes a packaging substrate comprising first and second opposing surfaces, and a trench provided in the first surface. A bridge is disposed in the trench. At least two chips in a side by side arrangement overly the bridge and the packaging substrate, wherein the bridge underlies peripheral edges of the at least two chips in the side by side arrangement. The at least two chips include a plurality of electric connections coupled to corresponding electrical connections on the bridge and on the packaging substrate.

A non-limiting example of an integrated circuit packaging structure according to embodiments of the invention includes an integrated circuit packaging structure free of an interposer layer includes a packaging substrate comprising first and second opposing surfaces, and a pedestal provided in the first surface. At least one bridge is disposed adjacent to the pedestal. At least two chips in a side by side arrangement overly the bridge and the packaging substrate, wherein the bridge underlies peripheral edges of the at least two chips in the side by side proximal arrangement. The at least two chips include a plurality of electric connections coupled to corresponding electrical connections on the bridge and on the packaging substrate.

A non-limiting example process for forming an integrated circuit packaging structure according to embodiments of the invention includes providing a packaging substrate after final layer buildup including first and second opposing surfaces. A trench is formed in the first surface of the packaging substrate, wherein the first surface includes a plurality of electrical connections. At least two chips in a side by side arrangement having electrical connections on surfaces thereof to corresponding electrical connections on a surface of at least one bridge are coupled to the bridge, wherein the bridge underlies peripheral edges of the at least two chips in the side by side arrangement. The bridge is placed in the trench and electrically coupled to the at least two chips and to the plurality of electrical connections on the first surface of the packaging substrate.

Additional features and advantages are realized through the techniques of the present invention. Other embodiments and aspects of the invention are described in detail herein and are considered a part of the claimed invention. For a better understanding of the invention with advantages and features, refer to the description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

FIG. 1 schematically illustrates a cross sectional view of a direct bonded heterogeneous integration structure in accordance with one or more embodiments of the present invention;

FIG. 2 schematically illustrates a cross sectional view of a direct bonded heterogeneous integration structure in accordance with one or more embodiments of the present invention;

FIG. 3 schematically illustrates a cross sectional view of a direct bonded heterogeneous integration structure in accordance with one or more embodiments of the present invention;

FIG. 4 schematically illustrates a cross sectional view of a direct bonded heterogeneous integration structure in accordance with one or more embodiments of the present invention;

DETAILED DESCRIPTION

Figure 5:
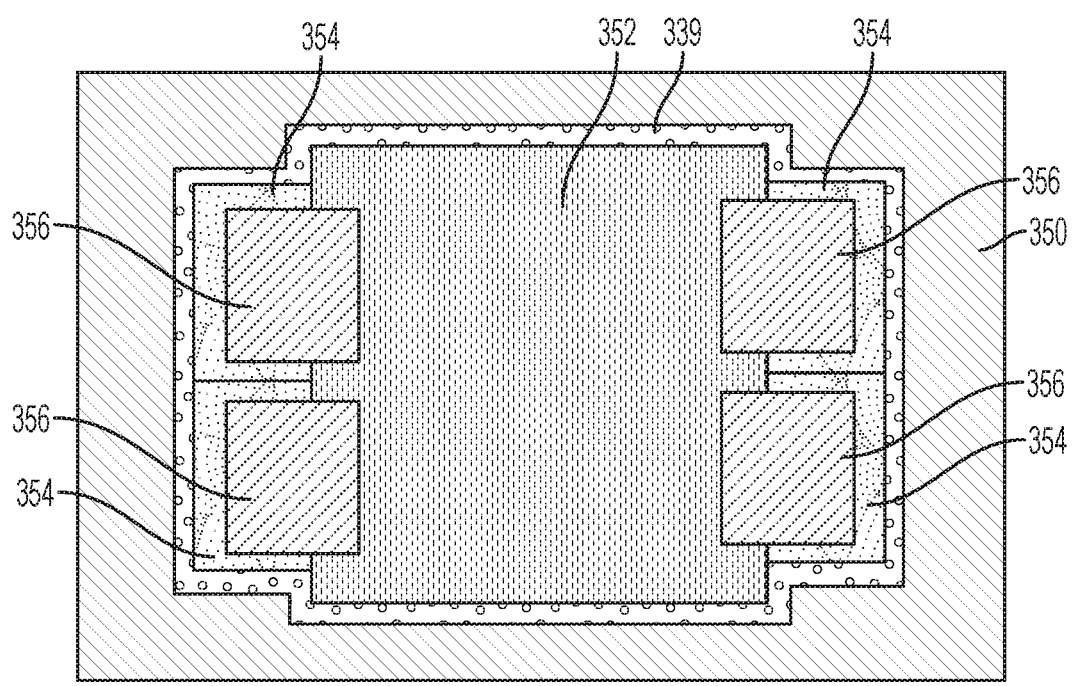
FIG. 5 is a bottom up view of a fixture including multiple chips and bridges in accordance with one or more embodiments of the present invention.

As stated above, the present invention generally relates to chip packaging structures, and more particularly, to direct bonded heterogeneous integration packaging structures. As used herein, the term "heterogeneous integration" generally refers to the assembly and packaging of multiple separately manufactured components onto a single package in order to improve functionality and enhance operating characteristics. Heterogeneous integration allows for the packaging of components of different types, different functionalities, different process technologies and nodes, and sometimes separate manufacturers. The combined devices can vary in type (e.g., bare chips or packages), functionality (e.g., processors, signal processors, cache, sensors, photonics, RF, and MEMS), technologies (e.g., one optimized for die size with another one optimized for low power) and nodes (22 nm, 14 nm, 7 nm, etc).

In these heterogeneous integration packaging structures, a chip carrier (i.e., packaging substrate), for example, an organic laminate substrate or the like, is utilized and modified following the formation of the final buildup layer to define a trench or pedestal therein. A bridge with or without a semiconductor chip (also referred to as an integrated circuit (IC) chip or "die") or a chip by itself (hereinafter referred to as the "bridge") is subsequently placed within the trench or in abutment against the pedestal and can be bonded therein using an adhesive. In one or more embodiments, the adhesive may be the same as the underfill epoxy used in subsequent processing. The surface of the bridge may or may not be coplanar with the top surface of the trench or pedestal. The chips are then subsequently attached to the bridge and packaging laminate using mass reflow or thermocompression or other chip-join techniques. This is followed by standard packaging processes for underfill, capping and marking.

In one or more embodiments of the present invention, the bridge can be simultaneously attached to multiple chips in an assembly fixture or a temporary carrier in a stacked configuration and can be subsequently aligned within the trench or in abutment against the pedestal. The chips and bridges are attached to the packaging laminate using mass reflow or thermocompression or other chip-join techniques. This is followed by standard packaging processes for underfill, capping and marking.

In still one or more other embodiments of the present invention, one chip can be joined to the bridge in an assembly fixture or a temporary carrier in a stacked configuration. Additional chips can be joined to the bridge in a sequential fashion in the same assembly fixture or temporary carrier. The chips and bridges are attached to the packaging laminate using mass reflow or thermo-compression or other chip-join techniques. This is followed by standard packaging processes for underfill, capping and marking. As is apparent, the particular methods are not intended to be limited and there are various permutations in forming the package including the bridges as will be discussed in greater detail below.

In still one or more other embodiments of the present invention, the multiple chips are produced as one joined unit by dicing from the wafer. The multiple chip unit is then joined to the bridges and packaging laminate using one of the techniques outlined above.

In still one or more embodiments of the present invention, the edges of the chips may be thinned where the bridges are to be attached. This will allow limiting the depth of the trench in the laminate substrate.

The bridge can be a silicon, a glass, an organic laminate or a silicon bridge with one or more organic redistribution layers on top of the bridge in polyimide or other thin film layers, or the like. Alternatively, the bridge itself can be a chip as noted above. The bridge subsequent to bonding can be dimensioned to provide an upper surface that is substantially coplanar or coplanar to the upper surfaces of the chip carrier. The overlying chips that are attached to the bridge are oriented such that an edge of one chip is proximal to an edge of another chip and is separated by a relatively small distance (d). The edges of the chips include electrical connections that are directly coupled to the corresponding electrical connection in the underlying bridge. That is, the bridge provided in the chip carrier underlies the peripheral edges of the overlying two chips. Each pair of chips having this proximal relationship are directly connected to the bridge disposed within the trench or abutting the pedestal in the chip carrier. As noted above, the bridge can simply include wiring to facilitate communication between the overlying chips or may include a chip for direct connection thereto.

The connections between the vertically arranged chips and bridge as described above may be a solder bump, a solder ball, a conductive stud, a conductive via, conductive pillar, conductive pad, or any other like connection device to achieve electrical connection between the dies. Localized dense fine pitch microbumps, for example, can be used to connect the underlying chip to the edges of the upper chips whereas a coarse pitch can be used for wiring attachment in the chip carrier. Any of those connection devices may be simply referred as a connection. The contact pads are used to mean interconnect points, bump pads, or any other conductive objects that make the connections. Thermocompression bonding or furnace reflow depending on the size of the various components can be used to provide the connections followed by or preceded by application of an underfill to complete the package.

It has been found that the direct bonding heterogeneous integration packaging structure and process as described herein advantageously eliminates the need for an interposer layer and through-silicon-vias (TSVs), thereby degradation of performance is minimized because of the shorter wiring routes between chips resulting in higher bandwidth and improved latency. Moreover, it should be apparent that multiple bridges in the packaging substrate can provide increased flexibility in die placement and allows for more complex designs. Consequently, not only are the formation of an interposer and TSVs eliminated during the packaging process but the added benefit, among others, is that no backside interposer processes are required to reveal the through-silicon-vias as is currently done in the 2.5D prior art that utilizes interposers and TSVs. Additionally, it should be noted that the direct bonded heterogeneous integration packaging structures and processes as will be described in greater detail below provide greater versatility in design and processing since the bridge is not embedded and direct bonding is effected. As such, no additional wiring levels are needed during the laminate buildup process since there is direct contact between the bridge in the packaging substrate and the at least two chips overlying the chip carrier package. As such, modification of the laminate buildup to provide the embedding is not needed as in the case of embedded multi-die interconnect bridges.

Detailed embodiments of the direct bonded heterogeneous integration packaging structures and processes of the present invention will now be described herein. However, it is to be understood that the embodiments of the invention described herein are merely illustrative of the structures that can be embodied in various forms. In addition, each of the examples given in connection with the various embodiments of the invention is intended to be illustrative, and not restrictive. Further, the figures are not necessarily to scale, some features can be exaggerated to show details of particular components. Therefore, specific structural and functional details described herein are not to be interpreted as limiting, but merely as a representative basis for teaching one skilled in the art to variously employ the methods and structures of the present description. For the purposes of the description hereinafter, the terms "upper", "lower", "top", "bottom", "left," and "right," and derivatives thereof shall relate to the described structures, as they are oriented in the drawing figures. The same numbers in the various figures can refer to the same structural component or part thereof.

As used herein, the articles "a" and "an" preceding an element or component are intended to be nonrestrictive regarding the number of instances (i.e. occurrences) of the element or component. Therefore, "a" or "an" should be read to include one or at least one, and the singular word form of the element or component also includes the plural unless the number is obviously meant to be singular.

As used herein, the terms "invention" or "present invention" are non-limiting terms and not intended to refer to any single aspect of the particular invention but encompass all possible aspects as described in the specification and the claims.

Conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Spatially relative terms, e.g., "beneath," "below," "lower," "above," "upper," and the like, can be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device can be otherwise oriented (rotated 90 degrees or at other orientations) and the spatially relative descriptors used herein interpreted accordingly.

It is to be understood that the various layers and/or regions shown in the accompanying drawings are not drawn to scale, and that one or more layers and/or regions of a type commonly used in complementary metal-oxide semiconductor (CMOS), fin field-effect transistor (FinFET), metal-oxide-semiconductor field-effect transistor (MOSFET), and/or other semiconductor devices, may or may not be explicitly shown in a given drawing. This does not imply that the layers and/or regions not explicitly shown are omitted from the actual devices. In addition, certain elements could be left out of particular views for the sake of clarity and/or simplicity when explanations are not necessarily focused on the omitted elements. Moreover, the same or similar reference numbers used throughout the drawings are used to denote the same or similar features, elements, or structures, and thus, a detailed explanation of the same or similar features, elements, or structures will not be repeated for each of the drawings.

The semiconductor devices and methods for forming same in accordance with embodiments of the present invention can be employed in applications, hardware, and/or electronic systems. Suitable hardware and systems for implementing embodiments of the invention can include, but are not limited to, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings of embodiments of the invention provided herein, one of ordinary skill in the art will be able to contemplate other implementations and applications of embodiments of the invention.

The embodiments of the present invention can be used in connection with semiconductor devices that could require, for example, CMOSs, MOSFETs, and/or FinFETs. By way of non-limiting example, the semiconductor devices can include, but are not limited to CMOS, MOSFET, and FinFET devices, and/or semiconductor devices that use CMOS, MOSFET, and/or FinFET technology.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

As used herein, the term "about" modifying the quantity of an ingredient, component, or reactant of the invention employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

It will also be understood that when an element, such as a layer, region, or substrate is referred to as being "on" or "over" another element, it can be directly on the other element or intervening elements can also be present. In contrast, when an element is referred to as being "directly on" or "directly over" another element, there are no intervening elements present, and the element is in contact with another element.

Turning now to FIG. 1, there is depicted a cross sectional view of an integrated circuit package 10 in accordance with various embodiments of the present invention. The illustrated integrated circuit package 10 is a direct bonded heterogeneous integration package including micro-bumps 27 and C4 bumps 20 providing chip-to-chip connections through a bridge (or an underlying chip) in accordance with one or more embodiments of the present invention. The chips can be configured to provide a variety of functions, e.g., microprocessor CPU or GPU, other ASICs, memory, etc.

The integrated circuit package 10 includes a base package substrate 12. As noted above, the base package substrate 12 can be an organic laminate or the like. Typically, the base package substrate 12 includes three distinct parts: the surface finish for soldering and adhesion, buildup layers that containing most of the wiring and vias and a core, which provides mechanical strength. Optionally, a solder mask is provided on the laminate or a build-up dielectric can be provided on the top surface with, for example, Cu studs at the surface. As such, the base substrate 12 can include a plurality of wiring layers 14 (including devices such as a transistor) and insulating layers.

Surface finish can be both an epoxy dielectric, which functions as a solder mask and metal migration barrier, and solder-bumped metal pads on a pattern matching that of the chip controlled collapse chip connections, for example (i.e., C4 connections). The build-up layers are typically characterized by copper trace dimensions such as width, thickness, and spacing. Almost all signal wiring in laminate substrates occurs in the build-up layers. The core is typically composed of glass-fiber-reinforced epoxy, jacketed in subtractively circuitized copper sheets. Most commonly, cores consist of a single dielectric layer, although multilayer cores can be used, formed by conventional laminated printed circuit board processing techniques.

Subsequent to formation of the final build up layer in the base package substrate 12, one or more trenches 16 are formed in an upper surface 18. The base package substrate can include pre-soldered bumps 20 on the upper surface 18 using surface mount technology to provide in electrical communication with one or more of the wiring levels (not shown) in the base packaging substrate.

On a backside surface 22 of the base packaging substrate 12, which is typically planar, one or more conductive metal connections 24 can be provided for subsequent attachment of the package 10 to the next level of assembly, such as a mother board, using interconnects such as ball grid array (BGA), land grid array (LGA), pin grid array (PGA), or the like.

The trenches 16, two of which are shown, have a width dimension and a height dimension effective to accommodate a bridge 26 disposed therein. In one or more embodiments, the upper surface of the bridge 26 is substantially coplanar or coplanar to the upper surface 18 of the packaging substrate 12. In one or more other embodiments, the upper surface of the bridge is not coplanar. The bridge 26 is disposed in and optionally affixed to the trench using an adhesive which can be the same underfill also used later when the chips are attached to the laminate. As previously discussed, the bridge 26 can be a silicon, a glass, an organic laminate or a silicon bridge with one or more organic redistribution layers on top of the bridge in polyimide or other thin film layers, or the like. Alternatively, the bridge itself can be a chip as noted above. The bridge can be separately fabricated with the desired features, e.g., wiring, chip, combinations thereof or the like. In one or more embodiments, the bridge 26 can be a chip by itself to provide greater versatility in design. The bridge 26 can include a plurality of micro-bumps 27 to facilitate electrical connection to the conductive pads formed on the overlaying chips. The pitch, diameter and height of the microbumps in the bridge region can be mixed (not shown), wherein larger microbumps can provide improved anchoring for the smaller microbumps. Alternatively, the microbump pitch on the bridge can be equal to the microbump pitch on the packaging substrate, wherein the microbumps have a uniform bump height on the bridge and on the packaging substrate.

In one or more embodiments of the present invention, the bridge can first be inserted into the trench (or adjacent to the pedestal), underfill can then be inserted into the trench to affix the bridge, and then two or more chips are attached to the bridge and laminate in one reflow. In one or more other embodiments of the present invention, the bridge(s) is (are) attached to all the chips in one reflow in an assembly fixture or when affixed to a temporary carrier, and a second reflow is used to attach the chips and bridge assembly to the laminate. In still one or more embodiments of the present invention, the bridge is attached to a first chip, then the bridge and attached chip is attached to a second chip, and so on. The attached chips and bridge assembly is attached to a laminate packaging substrate, wherein the total number of reflows is equal to the number of chips. Variants of the above methods can be used when the packaging substrate depending on the numbers of chips and bridges utilized in the packaging substrate and is not intended to be limited to the above methods.

After the chips and bridges are joined to each other and to the laminate substrate, an underfill 39 is used to fill the gaps between the chip, bridge and laminate surfaces. The chip, bridge and laminate assembly is heated to cure and solidify the underfill. The underfill decreases the displacement and fatigue failure of the C4 and micro-C4 interconnects due to the variation of the chip and package temperature during operation.

Subsequent to the underfill operation, a thermal interface material 34 is dispensed or applied between the chip 33 and a lid 28 and a lid adherent adhesive 42 is dispensed or applied between the laminate substrate 12 and lid periphery 28. The entire package assembly can be cured to solidify the thermal interface and lid adherent materials.

The lid 28 has a flat planar surface 30 facing the chips. The lid may be flat or can include a recess 32 as shown. The recess 32 is dimensioned to accommodate two or more chips 33; three of which are shown. The lid 28 may be made of metal or other high thermal conductivity material that provides good thermal performance.

Optionally, the packaging structure 10 may further include various types of mechanical stiffening structures to provide mechanical rigidity such as can be desired for flexible base package substrates such as polymer substrates and some organic laminate build up package substrates.

In the top down view of FIG. 2, there are five chips 33 provided in the integrated circuit package. By way of example, the chips 33 can be selected to form an accelerator package, which are generally desirable for providing higher bandwidth and lower latency. Accelerator packages generally include the chip carrying package substrate 28 multiple specific functioning chips including, for example, a microprocessor 40 such as a central processing unit ("CPU"), graphics processing unit ("GPU"), application specific integrated circuit ("ASIC") or the like. ASICs often include entire microprocessors, memory blocks including ROM, RAM, EEPROM, flash memory and other large building blocks. Such an ASIC is often termed a SoC (system-on-chip). The microprocessor 40 and the other chips 44 are coupled to the lid 28 and directly bonded to the bridge 50, which can be high bandwidth memory chips so as to reduce loading and provide higher performance during use because of the relatively short interconnect distance between the microprocessor and high bandwidth memory chips provided in the trench (or pedestal) of the packaging substrate.

In comparison to FIG. 1 which had trenches in the laminate substrate 104, FIG. 2 provides a cross sectional view of an integrated circuit package 100 with a pedestal 102 formed in a base packaging substrate 104 subsequent to fabrication of the final buildup layer. The base packaging substrate 104 can be formed by the lamination of a plurality of semiconductor substrates or organic substrates and can include a plurality of wiring layers 106 (including devices such as a transistor) and insulating layers as previously described. On a backside surface 110 of the base packaging substrate 104, which is typically planar, one or more conductive metal connections 112 can be provided for subsequent attachment of the package 100 to the next level of assembly, such as a mother board, using interconnects such as ball grid array (BGA), land grid array (LGA), pin grid array (PGA), or the like.

Bridges 114 are disposed proximate to the sidewalls defining the pedestal 102 and affixed to the packaging substrate 104 with an adhesive. The packaging substrate can be constructed such that connections 120 are formed on a surface 116 adjacent to the bridge and on the pedestal surface 118. The bridges 114 can be attached to a chip 140 joined to the pedestal 102 and to other chips or laminate structure 141 as may be desired for different applications. Different height connections can be used for connection to overlying chips or laminates 141. Likewise, the bridge 114 can include a plurality of connections 122 such as microbumps to facilitate electrical connection to the conductive connections 124 formed on the overlying chips.

The remaining elements of FIG. 2, underfill 150, thermal interface material 134, lid adherent 142 and lid 130, are similar to as discussed for FIG. 1.

FIG. 3 schematically illustrates a direct bonded packaging structure 200 for integrating multiple microprocessors in accordance with one or more embodiments. The packaging structure 200 includes a base packaging structure 210 similar to that described above but including a trench 212 having disposed therein a bridge 214 including wiring for electrically coupling the multiple overlying chips such as microprocessors 222. The microprocessors 222 can be bonded directly to the bridge 214 using connections 224 and to the packaging substrate 210 using connections 226. The microprocessors 222 are oriented such that an edge of one chip is proximal to an edge of another chip within the lid and is separated by a relatively small distance (d). That is, the bridge provided in the trench 212 underlies the peripheral edges of the overlying two chip.

FIG. 4 schematically illustrates a direct bonded packaging structure 300 integrating reconstituted wafers in accordance with one or more embodiments, wherein only known good dies are utilized. Exemplary reconstituted wafer processes include fan out wafer level packaging (FOWLP) processes, which generally takes individual known good dies 322 and precisely embeds them in a low cost material such as epoxy mold compound (EMC) 324 followed by making redistribution layer (not shown) atop the molded area (chip and fan-out area), and then formation of solder balls 326 on top. The bridge 330 can be attached directly to the molded dies, followed by placement of a bridge 330 provided in a trench 332 formed in packaging substrate 310 as generally described above. The underfill 312 and thermal interface material 314 are then applied and the lid 320 is provided to complete the packaging structure.

In one or more embodiments, wafer dicing can be employed to produce multiple die that can then be used in the above packaging structures. For example, dicing can be used to isolate two microprocessors or n-microprocessors that can then be attached to the bridge as described above to form the direct bonded heterogeneous integration packaging structures.

Referring now to FIG. 5, there is depicted a fixture 350 including five chips 352, 354 provided in the fixture 350. The fixture 350 can be precision machined, wherein the chips 352, 354 are placed at precise design distances. By way of example, the chips can be selected to form an accelerator package, which are generally desirable for providing higher bandwidth and lower latency. Accelerator packages generally include multiple specific functioning chips including, for example, a microprocessor 352 such as a central processing unit ("CPU"), graphics processing unit ("GPU"), application specific integrated circuit ("ASIC") or the like, and power supply chips 354. ASICs often include entire microprocessors, memory blocks including ROM, RAM, EEPROM, flash memory and other large building blocks. Such an ASIC is often termed a SoC (system-on-chip). The microprocessor 352 and the power supply chips 354 are coupled to the fixture 350 and then the "underlying" bridges 356 are attached to the chips, which can be high bandwidth memory chips so as to reduce loading and provide higher performance during use because of the relatively short interconnect distance between the microprocessor, the power supply chips, and underlying high bandwidth memory chips. The fixture including the chips 352, 354 and the bridges 356 can then be coupled to a packaging substrate such that the bridges are placed in the respective trench (or pedestal) of the packaging substrate 350.

Figure 6:
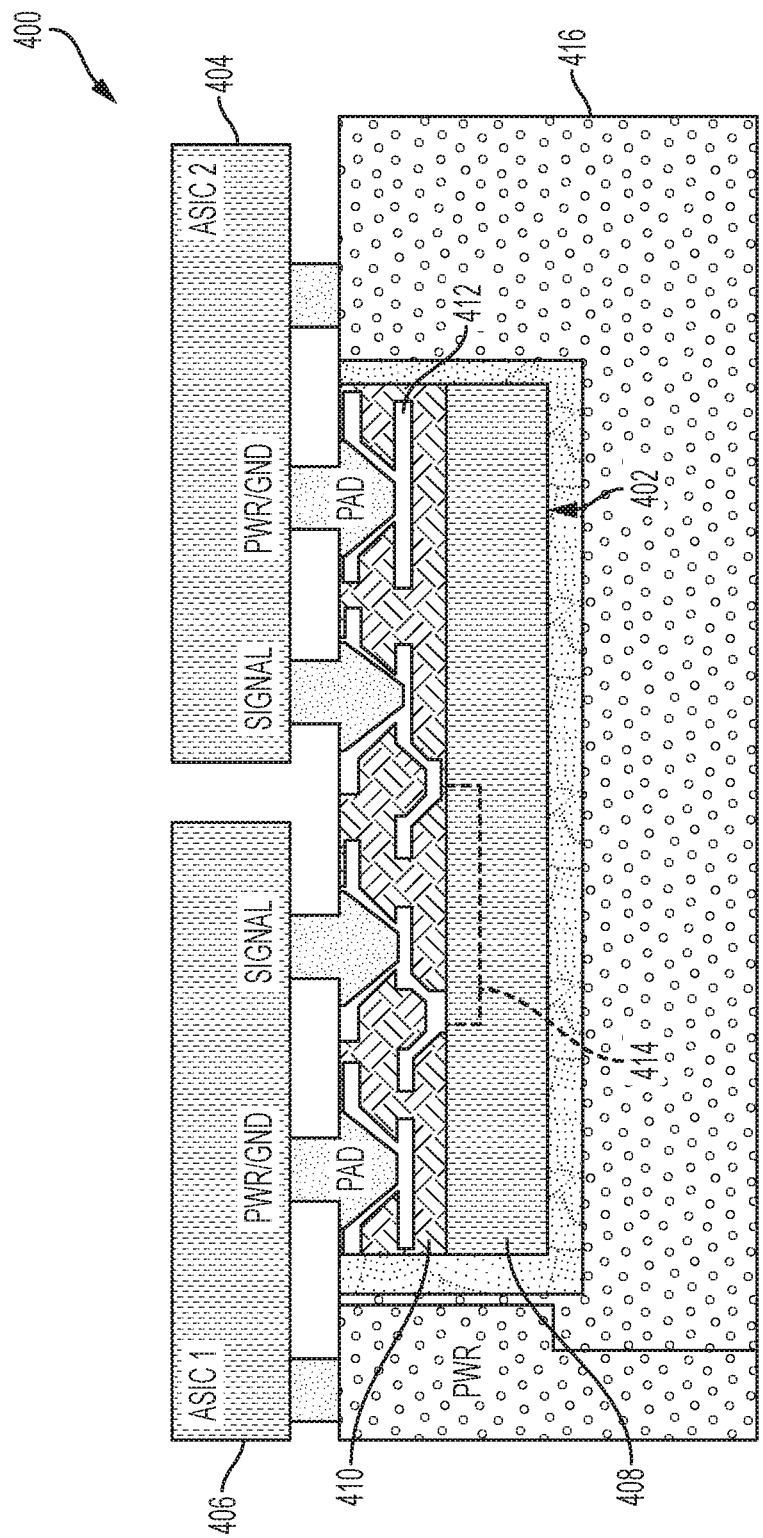
FIG. 6 schematically illustrates a cross sectional view of a direct bonded heterogeneous integration structure in accordance with one or more embodiments of the present invention.

FIG. 6 schematically illustrates a cross sectional view of a direct bonded heterogeneous integration structure in accordance with one or more embodiments of the present invention. The packaging structure 400 includes a hybrid silicon and organic bridge 402 that is attached to chips 404, 406. The hybrid silicon and organic bridge 402 includes a silicon substrate 408 and one or more thin film layers 410 including redistribution layers 412 formed using a wafer level fan out design. The thin film layer 410 on top of the silicon bridge can provide space transformation for pitch differences between chips and lower loss wires for power distribution or longer signal wires. As shown, the chips can be ASIC chips including signal and power ground connections to the bridge 402. The silicon substrate 408 can include wiring 414 to provide electrical communication between the two chips 404, 406. The chips 404, 406 and the bridge 402 can be attached to the packaging substrate 416 as previously described to complete the package.

It should be apparent that the underfill can be pre-applied within the trench (or the adjacent lower surface in the case of a pedestal; see FIG. 2) or the underfill can be fed into the trench (or adjacent lower surface in the case of a pedestal, see FIG. 2) after the bridge is inserted into the trench.

The descriptions of the various embodiments of the present invention have been presented for purposes of illustration, and are not intended to be exhaustive or limited to the embodiments of the invention described. Many modifications and variations will be apparent to those of ordinary skill in the art without departing from the scope and spirit of the described embodiments of the invention. The terminology used herein was chosen to best explain the principles of the embodiments of the invention, the practical application or technical improvement over technologies found in the marketplace, or to enable others of ordinary skill in the art to understand the embodiments of the invention described herein.

What is claimed is:

1. An integrated circuit packaging structure free of an interposer layer, the integrated circuit packaging structure comprising:
   a packaging substrate comprising first and second opposing surfaces, and a trench provided in the first opposing surface, wherein the first opposing surface defining the trench is free of electrical connections;
   a bridge disposed in the trench; and
   at least two chips in a side by side arrangement overlying the bridge and the packaging substrate, wherein the bridge underlies peripheral edges of the at least two chips in the side by side proximal arrangement, the at least two chips comprising a plurality of electric connections coupled to corresponding electrical connections on the bridge and on the packaging substrate, wherein each of the at least two chips are supported completely by the corresponding electrical connections and an underfill material.

2. The integrated circuit packaging structure of claim 1, further comprising a lid and a thermal interface material overlaying the chips.

3. The integrated circuit packaging structure of claim 1, further comprising an underfill material between the plurality of electrical connections coupled to the corresponding electrical connections on the bridge and the packaging substrate.

4. The integrated circuit packaging structure of claim 1, wherein the bridge comprises a chip.

5. The integrated circuit packaging structure of claim 1, wherein the bridge comprises wiring effective to provide electrical communication between the at least two chips in the side by side arrangement.

6. The integrated circuit packaging structure of claim 1, wherein the bridge comprises a memory chip or a microprocessor chip and the at least two chips in the side by side relationship comprise a microprocessor chip and a power supply chip.

7. The integrated circuit packaging structure of claim 1, wherein the packaging substrate comprises a laminate of multiple layers.

8. The integrated circuit packaging structure of claim 1, wherein the plurality of electrical connections on the least two chips and the corresponding electrical connections on the bridge and on the packaging substrate comprise a solder bump, a solder ball, a conductive stud, a conductive via, a conductive pillar, or combinations thereof.

9. The integrated circuit packaging structure of claim 1, wherein the at least two chips in a side by side arrangement comprise molded known good chips.

10. The integrated circuit packaging structure of claim 1, wherein the at least two chips in a side by side arrangement comprise multiple chips diced from a wafer as a group.

11. An integrated circuit packaging structure free of an interposer layer, the integrated circuit packaging structure comprising:
a packaging substrate comprising first and second opposing surfaces, a pedestal provided in the first surface;
at least one bridge having one end disposed adjacent to the pedestal; and
at least two chips in a side by side arrangement overlying the at least one bridge and the packaging substrate, wherein the at least one bridge underlies peripheral edges of the at least two chips in the side by side arrangement, the at least two chips comprising a plurality of electric connections coupled to corresponding electrical connections on the bridge and on the packaging substrate, wherein the corresponding electrical connections on the packaging substrate are adjacent to another end of the bridge and on the pedestal, wherein the corresponding electrical connections adjacent to the other end of the bridge are larger than the corresponding electrical connections on the pedestal.

12. The integrated circuit packaging structure of claim 11, wherein the at least one bridge comprises a chip.

13. The integrated circuit packaging structure of claim 11, wherein the at least one bridge comprises wiring effective to provide electrical communication between the at least two chips in the side by side arrangement.

14. The integrated circuit packaging structure of claim 11, wherein the at least one bridge is a high bandwidth memory chip and the at least two chips in the side by side proximal arrangement comprise a microprocessor chip and a power supply chip.

15. The integrated circuit packaging structure of claim 11, wherein the plurality of electrical connections on the least two chips are coupled to corresponding electrical connections on the at least one bridge and on the packaging substrate comprise a solder bump, a solder ball, a conductive stud, a conductive via, a conductive pillar, or combinations thereof.

* * * * *